(12) United States Patent
Bicais et al.

(10) Patent No.: US 10,979,275 B2
(45) Date of Patent: Apr. 13, 2021

(54) LINK ADAPTATION METHOD USING A POLAR MODULATION CONSTELLATION

(71) Applicant: COMMISSARIAT A L'ENERGIE ATOMIQUE ET AUX ENERGIES ALTERNATIVES, Paris (FR)

(72) Inventors: Simon Bicais, Grenoble (FR); Jean-Baptiste Dore, Grenoble (FR); Jose-Luis Gonzales Jimenez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/818,798

(22) Filed: Mar. 13, 2020

(65) Prior Publication Data
US 2020/0351141 A1 Nov. 5, 2020

(30) Foreign Application Priority Data
Mar. 15, 2019 (FR) .................................... 19 02720

(51) Int. Cl.
| H04L 27/34 | (2006.01) |
| H04L 27/38 | (2006.01) |
| H03M 13/11 | (2006.01) |
| H04L 7/06 | (2006.01) |

(52) U.S. Cl.
CPC ..... H04L 27/3405 (2013.01); H03M 13/1174 (2013.01); H04L 7/06 (2013.01); H04L 27/3809 (2013.01)

(58) Field of Classification Search
CPC ... H04L 27/3405; H04L 27/3809; H04L 7/06; H03M 13/174

USPC ......................................................... 375/261
See application file for complete search history.

(56) References Cited

U.S. PATENT DOCUMENTS

| 5,828,695 | A | 10/1998 | Webb | |
| 2005/0074068 | A1* | 4/2005 | Borran | ................ H04L 27/3433 375/264 |
| 2016/0056989 | A1* | 2/2016 | Murakami | .............. H04L 27/34 375/298 |

FOREIGN PATENT DOCUMENTS

WO   WO 2018/116411 A1   6/2018

OTHER PUBLICATIONS

French Preliminary Search Report dated Jan. 9, 2020 in French Application 19 02720 filed on Mar. 15, 2019 (with English Translation of Categories of Cited Documents), 2 pages.
(Continued)

*Primary Examiner* — Ted M Wang
(74) *Attorney, Agent, or Firm* — Oblon, McClelland, Maier & Neustadt, L.L.P.

(57) ABSTRACT

The present invention relates to a method for adapting a link using a polar-modulation (PQAM) constellation. It applies in particular to the communications in the sub-THz band, in which the oscillator of the receiver has phase fluctuations. In a PQAM-modulation constellation, the modulation symbols are distributed on concentric circles equidistant in the complex plane, each circle including the same number of symbols, the angular distribution of the symbols on a circle being uniform and identical regardless of the circle. The adaptation of the link is carried out by taking into account the thermal noise as well as the phase noise.

3 Claims, 5 Drawing Sheets

(56) References Cited

OTHER PUBLICATIONS

Lianjun Deng, et al., "Performance of Circular QAM Constellations Using Partial Channel Coding with Parallel Double Gray Mapping",19th International Symposium on Wireless Personal Multimedia Communications (WPMC), National Institute of Information and Communications Technology (NICT), Nov. 4, 2016, XP033106608, pp. 400-405.

Bernhard Goebel, et al.,"Calculation of Mutual Information for Partially Coherent Gaussian Channels With Applications to Fiber Optics", IEEE Transactions on Information Theory, vol. 57, No. 9, Sep. 1, 2011, XP011382281, pp. 5720-5736.

Christian Hager, et al., "Design of APSK constellations for Coherent Optical Channels with Nonlinear Phase Noise", IEEE Transactions on Communications, vol. 61, No. 8, Aug. 2013, 11 pages.

U.S. Appl. No. 16/781,000, filed Feb. 4, 2020, Demmer et al.

* cited by examiner

LINK ADAPTATION METHOD USING A POLAR MODULATION CONSTELLATION

TECHNICAL FIELD

The present invention relates to the field of digital modulation, and more particularly very-high-bitrate APSK (Amplitude and Phase Shift Keying) modulations. It can in particular be used in the sub-THz communications envisaged in future telecommunication standards.

PRIOR ART

The growing demand for bandwidth from users has led to the emergence of new technological solutions in the last-generation mobile telecommunications networks, such as massive MIMO (Multiple Input Multiple Output), cellular densification via small cells, multi-RAT (Radio Access Technology) access using together the sub-6 GHz band and the millimetric band. More recently, it has been proposed to use spectral bands between 100 and 300 GHz, called sub-THz, for very-high-bitrate communications. These sub-THz communications are envisaged for example for the point-to-multipoint links in which a base station transmits data at a very high bitrate and low distance to a plurality of mobile terminals on the downstream connection or to establish point-to-point links between base stations in the backhaul network.

The use of the sub-THz bands involves, however, solving problems of energy consumption, of stability of the oscillators and of being able to reach high orders of modulation. The difficulty in producing stable oscillators in this frequency range as well as the necessity of using high orders of modulation to obtain ever-increasing data bitrates make it so that sub-THz communication systems are very sensitive to phase noise. This phase noise affects both the oscillator of the emitter and that of the receiver. To this phase noise is added the conventional problem of offset between the frequency of the oscillator of the receiver and that of the oscillator of the emitter or CFO (Frequency Offset). The symbol error rate can thus become very high.

Various strategies for optimization of modulation constellations have been proposed in the prior art to minimize the symbol error rate. In particular, the article of C. Hager et al. entitled "Design of APSK constellations for coherent optical channels with nonlinear phase noise", IEEE Transactions on Communications, vol. 61, no 8, August 2013, discloses modulation constellations having good robustness to non-linear phase noise in the case in which the receiver uses a sub-optimal detection module with two stages, a first stage carrying out a detection of amplitude and a phase correction, and a second stage carrying out a phase detection.

However, these strategies are not optimal insofar as they do not seek to minimize the bit error rate or BER (Bit Error Rate) but simply the symbol error rate or SEP (Symbol Error Probability). Moreover, the constellations obtained are not structured and thus difficult to use for high orders of modulation. Finally, these strategies do not address the way to adapt the link between the emitter and the receiver in the presence of phase noise, to obtain low bit error rates.

DISCLOSURE OF THE INVENTION

The present invention is defined by a method for adapting a link as claimed below. Alternative embodiments are specified in the dependent claims.

BRIEF DESCRIPTION OF THE DRAWINGS

Other features and advantages of the invention will appear upon reading a preferred embodiment of the invention, described in reference to the appended drawings in which.

DETAILED DISCLOSURE OF SPECIFIC EMBODIMENTS

Figure 1:
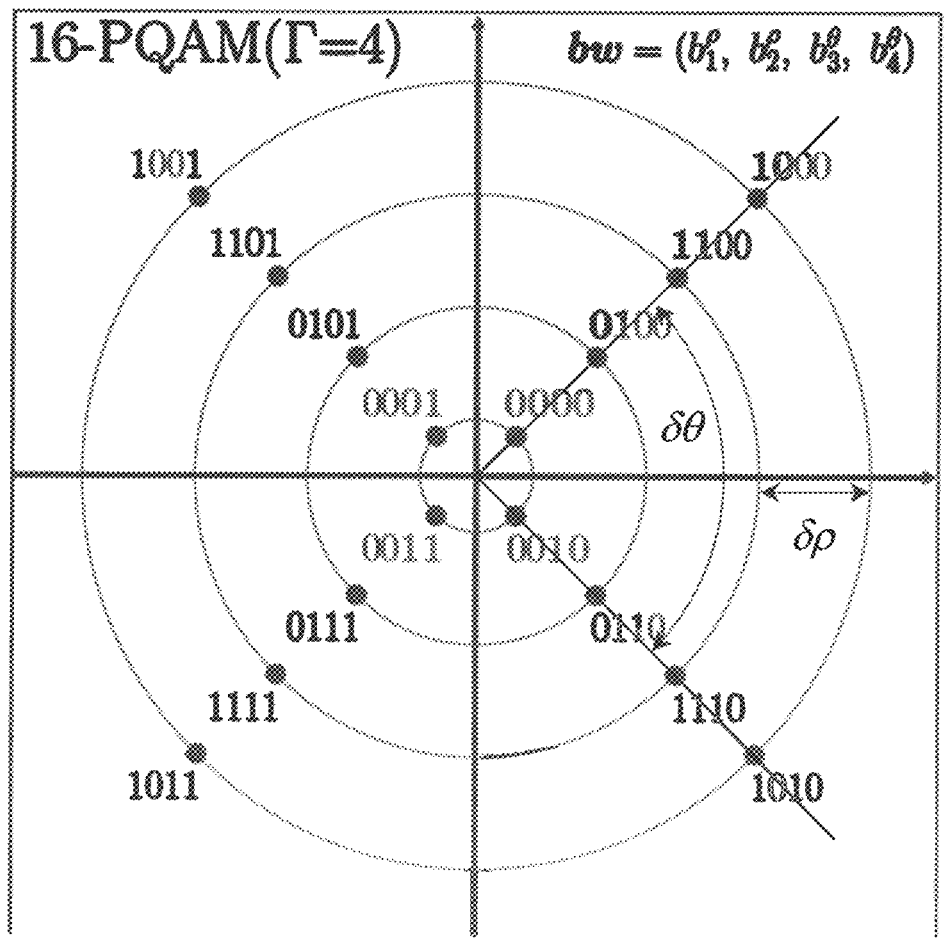
FIG. 1 shows an example of a modulation constellation used by a modulation method according to an embodiment of the present invention.

Below, communication over a transmission channel affected by phase noise between an emitter and a receiver will be considered. For example, the communication can be that between a base station and a mobile terminal in the sub-THz band. Recent measurement campaigns have shown that the direct path or LOS (Line Of Sight) dominated in such communications.

The signal received in the baseband at the time k can be expressed in the form:

$$r(k)=s(k)e^{j\varphi(k)}+n(k) \tag{1}$$

where s(k) is the symbol emitted at the time k, φ(k) is the phase noise representing the sum of the phase noise of the emitter and that of the receiver, n(k) is a sample of additive white Gaussian noise (AWGN) having a variance $\sigma_n^2$.

The phase noise can be considered as the sum of a Gaussian random variable (having a variance $\sigma_p^2$) and a Wiener (also called Wiener-Lévy) stochastic process, that is to say with stationary independent increments following a Gaussian distribution (having a variance $\sigma_w^2$). It can be shown that the spectral density of the phase noise is the sum of a constant (white noise) and of a Lorentzian contribution (Wiener-Lévy process). The Lorentzian contribution is dominant at the low frequencies but becomes negligible with respect to the white-noise component above a cutoff frequency proportional to the ratio $$\frac{\sigma_w^2}{\sigma_p^2}.$$

When this cutoff frequency, $f_c$, is less than $$\frac{B \cdot c}{\sqrt{N}}$$

where B is the width of the band used for the transmission, N is the length of a frame transmitted and $$c = \sqrt{\frac{\ln 2}{2\pi^2}},$$

the Lorentzian contribution can be ignored. Since this condition is generally verified in sub-THz communications, hereinafter it is supposed, unless otherwise mentioned, that the Lorentzian contribution can be ignored in the phase noise.

The digital modulation method used by the present invention transforms words of m bits into complex symbols belonging to a modulation constellation, C, of order M where $M=2^m$, the complex symbols modulating a carrier wave via quadrature modulation.

Said complex symbols are distributed over $\Gamma=2^n$ equidistant concentric circles where $m>n+1$ and $n>1$, each of the concentric circles carrying the same plurality $M/\Gamma$ of symbols. The angular distribution of the complex symbols is uniform and identical on each of the concentric circles. More precisely, the constellation C is defined by the set of complex symbols:

$$C = \left\{ \left( \frac{\delta \rho}{2} (2q-1) \exp\left(j \frac{\delta \theta}{2}(2p-1)\right) \right) \Big| 1 \le q \le \Gamma; 1 \le p \le \frac{M}{\Gamma} \right\} \quad (2)$$

where $$\delta \rho = \sqrt{E_s} \cdot \sqrt{\frac{12}{4\Gamma^2 - 1}}$$

is the radial distance between consecutive concentric circles, $E_s$ is the average power of the symbols of the constellation, and where $$\delta \theta = 2\pi \frac{\Gamma}{M}$$

is the angular offset between two consecutive symbols on the same concentric circle. Thus the modulation constellation is parameterized by the order of modulation, M, and the number of concentric circles, $\Gamma$. Hereinafter it will therefore be noted as $C(M,\Gamma)$.

The successive symbols of a circle corresponding to two words of m bits having a Hamming distance equal to 1. Likewise, two symbols disposed on the same radius, that is to say aligned in the same angular direction, and belonging to two successive concentric circles, correspond to two words of m bits having a Hamming distance equal to 1. In other words, two adjacent modulation symbols, whether they are located on the same circle or on the same radius of the constellation, represent words only differing by a single bit.

For this purpose, each word of m bits to be modulated is coded into a word of a first Gray code having a size n and into a word of a second Gray code having a size (m−n). In other words, the word to be modulated bw can be represented by:

$$bw = (b_1^\rho, \ldots, b_n^\rho, b_1^\theta, \ldots, b_{m-n}^\theta) \quad (3)$$

It consists of a first portion, $b_1^\rho, \ldots, b_n^\rho$, giving the index of the concentric circle on which the modulation symbol is located and of a second portion, $b_1^\theta, \ldots, b_{m-n}^\theta$, giving the index of the argument of this complex symbol.

Finally, the digital modulation used by the present invention can be considered as a bijective function F of $\{0,1\}^m$ in $C(M,\Gamma)$ such that:

$$F(bw) = \frac{\delta p}{2}(2q-1) \cdot \exp\left(j\frac{\delta\theta}{2}(2p-1)\right) \quad (4)$$

where q is the integer corresponding to the word of the first Gray code $b_1^\rho, \ldots, b_n^\rho$ and p is the integer corresponding to the word of the second Gray code $b_1^\theta, \ldots, b_{m-n}^\theta$. This modulation method will conventionally be called PQAM (Polar-QAM).

FIG. 1 shows a PQAM digital modulation constellation that can be used in the context of the present invention.

More precisely, the constellation shown is the constellation C(16,4), that is to say of order M=16 (m=4) and having a number of concentric circles $\Gamma=4$ (n=2). The radial distance between concentric circles is indicated by $\delta \rho$ and the angular offset between successive symbols of the same circles is noted as $\delta \theta$ (here $\delta \theta = \pi/2$). In the present case, the two most significant bits (MSB) form a first Gray code indexing the concentric circles. The two most significant bits (LSB) form a second Gray code indexing the symbols on the same circle.

Upon reception, the decisions on the symbols are taken on the basis of the polar coordinates $(\rho_r, \theta_r)$ of the received signal r. Hereinafter, the notation $(\rho_s, \theta_s)$ will be used to designate the polar coordinates of a symbol s.

In the absence of coding, the bits can be estimated by taking a hard decision on the basis of the received signal. More precisely, the symbol transmitted is advantageously estimated by the receiver via:

$$\hat{s} = \underset{s \in C}{\operatorname{argmin}} \left[ (\rho_s - \rho_r)^2 + \frac{1}{\gamma^2}(\theta_s - \theta_r)^2 \right] \quad (5)$$

The bits transmitted then being estimated by $(\hat{b}_1, \ldots, \hat{b}_m) = F^{-1}(\hat{s})$. The term in brackets is a distance defined in polar coordinates, $d_\gamma(s,r)$, defined by:

$$d_\gamma^2(s, r) = (\rho_s - \rho_r)^2 + \frac{1}{\gamma^2}(\theta_s - \theta_r)^2 \quad (6)$$

where $$\gamma = \frac{\sigma_p^2}{\sigma_n^2} + \frac{1}{E_s} \cdot \frac{\sigma_p^2}{\sigma_n^2}$$

is the ratio between the power of the phase noise and that of the additive (thermal) noise on the channel, and $E_s$ is the average energy of the symbols of the constellation.

In the presence of coding with probabilistic input, for example LDPC coding, the bits transmitted can be estimated by soft decision by calculating the logarithmic likelihood ratios:

$$LLR(b_i) = \log\left(\frac{p(b_i = 1 | r)}{p(b_i = 0 | r)}\right) \quad (7)$$

where $p(b_i = \eta | r)$ represents the probability that the bit $b_i$ equals $\eta$ given that the received signal is the complex value r. The logarithmic likelihood ratios can be calculated by:

$$LLR(b_i) = \log\left(\frac{\sum_{s_1 \in C_1^i} p(r|s_1)}{\sum_{s_0 \in C_0^i} p(r|s_0)}\right) \quad (8)$$

where $C_0^i$ (resp. $C_1^i$) is a subset of symbols of $C(M,\Gamma)$ satisfying $b_i=0$ (resp. $b_i=1$). The previous expression can be simplified via the max-log sum approximation (also called max-log), according to which the sums are approached by the dominant probability terms:

$$LLR(b_i) \approx \max_{s_i \in C_1^i} \log(p(r|s_1)) - \max_{s_i \in C_0^i} \log(p(r|s_0)) \quad (9)$$

or:

$$LLR(b_i) \approx \max_{s_0 \in C_0^i} (d_\gamma^2(r;s_0)) - \max_{s_i \in C_1^i} (d_\gamma^2(r;s_1)) \quad (10)$$

Figure 2A:
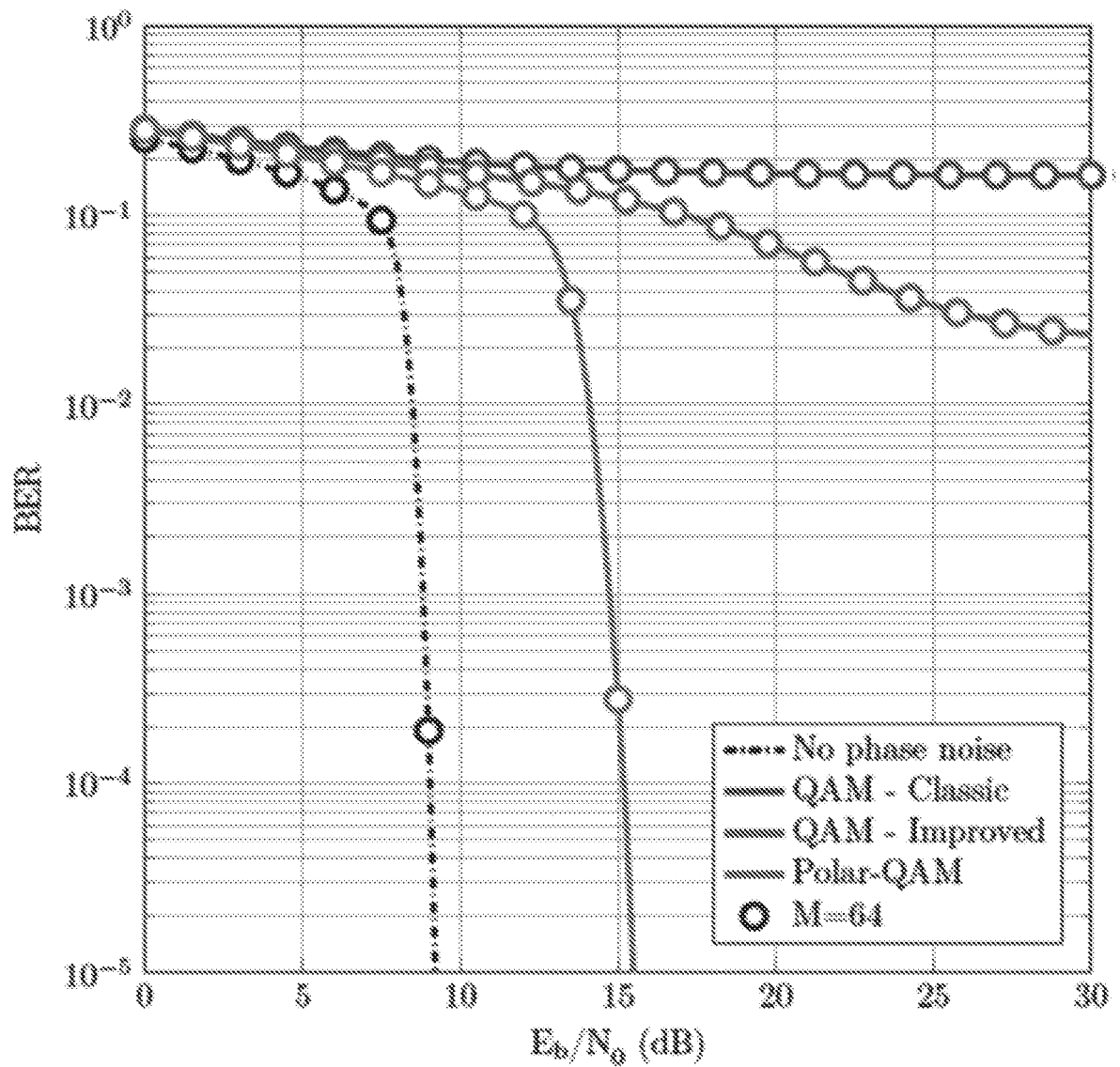
FIGS. 2A and 2B show curves of bit error rate as a function of the signal-to-noise ratio for a PQAM modulation method and a conventional QAM modulation method.
Figure 2B:
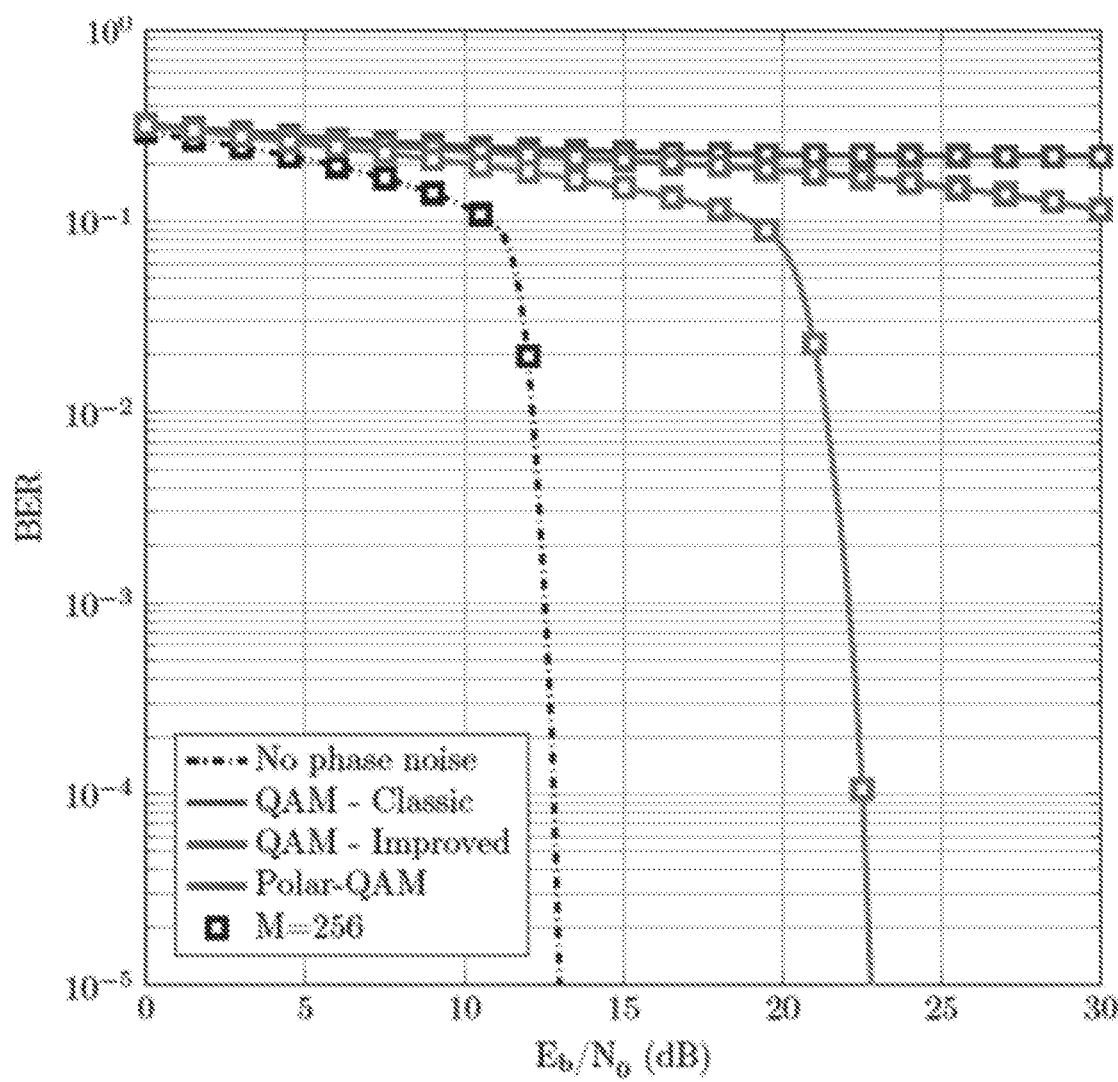

FIGS. 2A-2B show curves of bit error rate as a function of the ratio $E_b/N_0$ for PQAM modulation and a conventional QAM method.

The signal-to-noise ratio is equal to $E_s/(N_0/2)$ where $E_s=mE_b$ is the energy per symbol, $E_b$ is the energy per bit and $N_0$ the bilateral spectral density of noise.

The curves are given for a phase-noise power $\sigma_p^2=0.1$.

In the case of FIG. 2A, the modulation used had an order M=64 (words have a size m=6 bits) and in that of FIG. 2B it had an order M=256 (mots have a size m=8 bits), the number of concentric circles was $\Gamma=8$ in the case of FIG. 2A and $\Gamma=32$ in that of FIG. 2B.

The words subject to the digital modulation come from LDPC coding with a rate of ⅔ with length of blocks of 1944 bits and soft decoding of the min-sum type and 50 decoding iterations.

It is noted that the level of BER obtained via the PQAM (or Polar-QAM in the drawings) modulation method is substantially less than that of a conventional QAM modulation of the same order, the difference occurring for an SNR of 13 dB when M=64 and of 20 dB when M=256.

The PQAM modulation disclosed above is used in a mechanism for adapting a link according to an embodiment of the invention. It is recalled that the adaptation of a link involves modifying, in an adaptive manner, the modulation and coding scheme (MCS scheme) of the bits of information according to the quality of the channel (in particular its signal-to-noise ratio), to obtain a target BER for a given bitrate, or inversely to obtain a target bitrate on the basis of a given BER.

In the present case, and in an original manner, the phase noise is also taken into account in the adaptation of the link.

The bit error rate, $$p_{be} = \frac{p_{se}}{m}$$

can be calculated analytically via:

$$p_{se} = \quad (12)$$
$$1 - Pr(\hat{s} = s | s) = 1 - \left[Pr\left(-\frac{\delta\rho}{2} < \Delta\rho < \frac{\delta\rho}{2}\right) Pr\left(-\frac{\delta\theta}{2} < \Delta\theta < \frac{\delta\theta}{2}\right)\right]$$

the decision region ML $\hat{s}=s$ being defined by the ranges $\delta\rho, \delta\theta$ around the symbol s.

$$p_{se} \simeq 2\left[Q\left(\frac{\delta\rho}{2\sigma_n}\right) + Q\left(\frac{\delta\theta}{2\sqrt{\sigma_p^2 + \sigma_n^2/E_s}}\right)\right] \quad (13)$$

where $$Q(x) = \frac{1}{\sqrt{2\pi}} \int_x^\infty \exp\left(-\frac{u^2}{2}\right) du$$

is the complementary distribution function of the reduced centered normal distribution, $N(0,1)$. Taking into account the expressions of $\delta\rho$ and $\delta\theta$ according to M and $\Gamma$, and the fact that $E_b = E_s/m$:

$$p_{be} \simeq \frac{2}{m}\left[Q\left(\sqrt{\frac{3SNR}{4\Gamma^2 - 1}}\right) + Q\left(\frac{\pi\Gamma}{M\sqrt{\sigma_p^2 + 1/SNR}}\right)\right] \quad (14)$$

where $$SNR = \frac{2mE_b}{N_0}.$$

Figure 3:
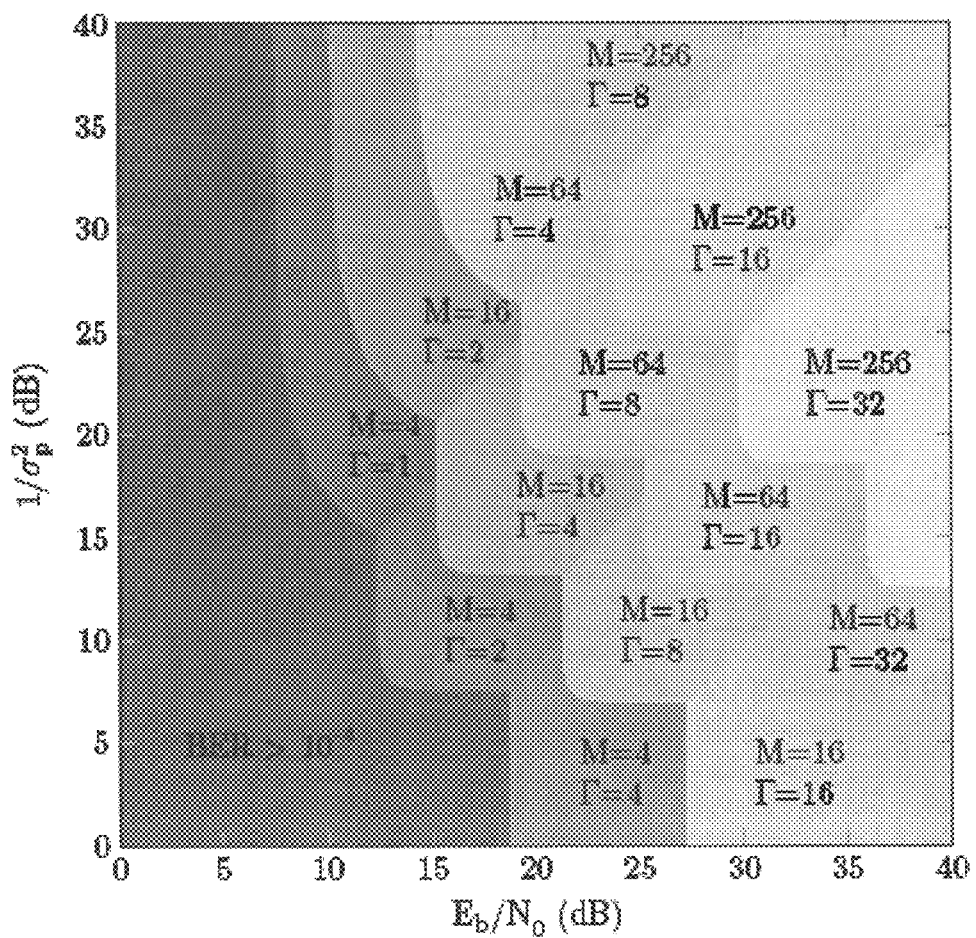
FIG. 3 shows a diagram of selection of a modulation constellation by a method for adapting a link according to an embodiment of the invention.

FIG. 3 shows a diagram of selection of a PQAM modulation constellation by a method for adapting a link according to an embodiment of the invention.

More precisely, this diagram gives, for a target bit error rate (here BER<$10^{-4}$), the modulation constellations compatible with a given level of phase noise and a given level of thermal noise. The abscissae show the signal-to-noise ratio, $E_b/N_0$, and the ordinates show the inverse of the power of the phase noise, $$\frac{1}{\sigma_p^2}.$$

This diagram is obtained by calculating the BER from the expression (14), according to the signal-to-noise ratio $E_b/N_0$ and the phase-noise power, $\sigma_p^2$, for various values of M and $\Gamma$. The values of M and $\Gamma$ compatibles with the target BER are indicated in the diagram.

Figure 4:
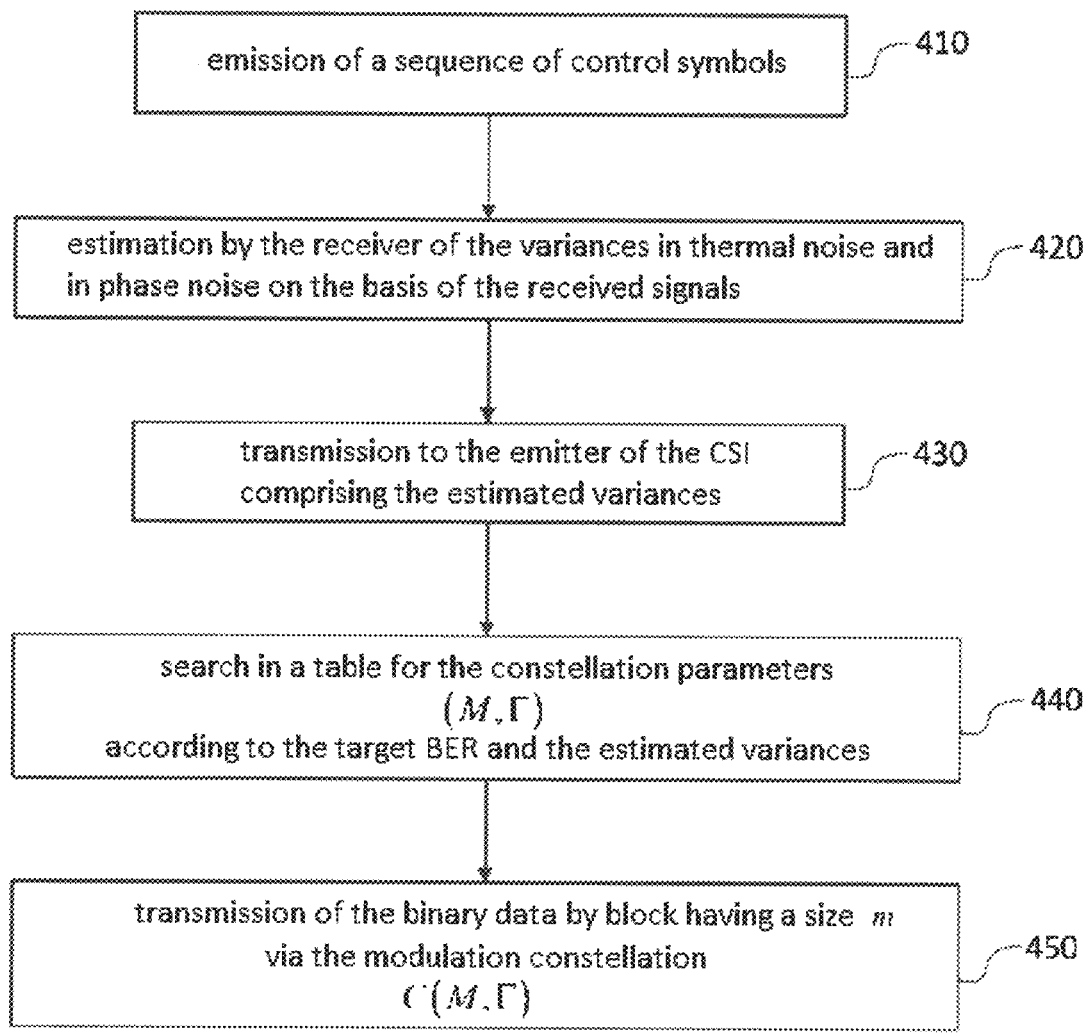
FIG. 4 shows the flowchart for a method for adapting a link according to an embodiment of the invention.

FIG. 4 shows the flowchart for a method for adapting a link according to an embodiment of the invention.

In step 410, the emitter transmits a plurality N of control symbols, for example in a header of a transmission frame. These control symbols are by definition known to the receiver and are not necessarily part of a constellation $C(M,\Gamma)$ in the sense defined above. For example, symbols having the same amplitude $\sqrt{E_s}$ are chosen.

In step 420, the receiver estimates, on the basis of the received signal, the variances in thermal noise (or additive noise) and in phase noise affecting the transmission channel. More precisely:

$$\sigma_n^2 = \frac{1}{N}\sum_{k=1}^N (\rho_k - \sqrt{E_s})^2 \quad (15\text{-}1)$$

and $$\sigma_p^2 = \frac{1}{N}\sum_{k=1}^{N}(\theta_k - \arg(s_k))^2 - \frac{\sigma_n^2}{E_s} \quad (15\text{-}2)$$

where $s_k$, k=1, ..., N are the control symbols, and $r(k)=\rho_k e^{j\theta_k}$, k=1, ..., N the signals received in the baseband, corresponding to these control symbols.

In step 430, the receiver returns to the emitter a piece of channel state information or CSI (Channel State Information) comprising an estimation of the phase-noise variance and an estimation of the variance in the thermal noise (or of the SNR, $$\frac{E_s}{\sigma_n^2} = \frac{mE_b}{\sigma_n^2}).$$

In step 440, the emitter consults a table, the inputs of which (discretized) are the target bit error rate (BER) and the variances in thermal noise and phase noise. This table gives the optimal values of the parameters M,Γ compatible with the triplet of inputs provided (namely the variance in additive noise, the variance in the phase noise and the target bit error rate).

If necessary, this table also includes as an input the parameters of various types of channel coding with various rates. In all cases, the table in question has been precalculated and stored in a memory of the emitter. It contains the values M,Γ of the constellations C(M,Γ) compatible with the triple of inputs provided. More particularly, it contains the optimal values M,Γ satisfying the constraint:

$$\frac{2}{m}\left[Q\left(\sqrt{\frac{6E_s/\sigma_n^2}{4\Gamma^2-1}}\right)+Q\left(\frac{\pi\Gamma}{M\sqrt{\sigma_p^2+1/(2E_s/\sigma_n^2)}}\right)\right] \leq BER \quad (16)$$

with the same notation conventions as in the expression (14).

In step 450, the emitter modulates the binary data (if necessary after having coded them via channel coding) by grouping by blocks of $\log_2(M)$ bits to generate the corresponding modulation symbols of the constellation C(M,Γ). These modulation symbols then modulate a carrier via quadrature modulation, in a manner known per se.

The invention claimed is:

1. Method for adapting a link between an emitter and a receiver, the emitter grouping together binary data to be transmitted in the form of blocks having a length m=$\log_2$ M, and transforming said blocks into complex symbols via digital modulation to transmit them over a transmission channel, said symbols belonging to a polar-modulation constellation C(M,Γ) of order M consisting of Γ=$2^n$ equidistant concentric circles where m>n+1 and n>1, each of the concentric circles carrying the same plurality M/Γ of symbols, the angular distribution of said symbols being uniform and identical on each of the concentric circles, two successive symbols on a circle corresponding to two words of m bits having a Hamming distance equal to 1 and two symbols, in the same angular direction, belonging to two successive concentric circles, corresponding to two words of m bits having a Hamming distance equal to 1, said method for adapting a link being characterized in that:

the emitter transmits a sequence of control symbols to the receiver via the transmission channel;

the receiver derives, from the control symbols received, an estimation of the variance in the additive noise as well as an estimation of the variance in the phase noise affecting the transmission channel and sends back to the emitter, via an indicator of state of the channel, the estimated variances;

the emitter reads in a table stored in a memory, on the basis of the values of said variances and a target bit error rate, an order M as well as a number Γ of concentric circles compatible with a target bit error rate;

the emitter transmits, over the link, said binary data via a modulation constellation of order M and having a number of concentric circles, Γ, thus read in the table.

2. Method for adapting a link according to claim 1, characterized in that for a target bit error rate BER, a pair of variances in additive noise $\sigma_n^2$ and a phase noise $\sigma_p^2$, the table contains a pair of optimal parameters M,Γ, satisfying $$\frac{2}{m}\left[Q\left(\sqrt{\frac{6E_s/\sigma_n^2}{4\Gamma^2-1}}\right)+Q\left(\frac{\pi\Gamma}{M\sqrt{\sigma_p^2+1/(2E_s/\sigma_n^2)}}\right)\right] \leq BER,$$

where Q(·) is the complementary distribution function of the reduced centered normal distribution and $E_s$ is the energy per symbol.

3. Method for adapting a link according to claim 1, characterized in that the table also includes as an input parameters of various types of channel coding.

\* \* \* \* \*